(12) United States Patent
Tukel

(10) Patent No.: US 7,671,770 B2
(45) Date of Patent: Mar. 2, 2010

(54) SINGLE PASS INL TRIM ALGORITHM FOR NETWORKS

(75) Inventor: Suat Sukuti Tukel, San Bruno, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/147,328

(22) Filed: Jun. 26, 2008

(65) Prior Publication Data

US 2009/0322575 A1    Dec. 31, 2009

(51) Int. Cl.
*H03M 1/10* (2006.01)

(52) U.S. Cl. .................. 341/121; 341/118; 341/119; 341/120; 341/155

(58) Field of Classification Search .......... 341/120, 341/121, 161, 118, 144, 155, 152, 159, 150
See application file for complete search history.

(56) References Cited

U.S. PATENT DOCUMENTS

| | | | | |
|---|---|---|---|---|
| 5,635,937 | A | * | 6/1997 | Lim et al. ............... 341/161 |
| 5,712,633 | A | * | 1/1998 | Bae ......................... 341/120 |
| 5,861,826 | A | * | 1/1999 | Shu et al. ................. 341/120 |
| 5,973,631 | A | | 10/1999 | McMullen et al. |
| 6,140,949 | A | | 10/2000 | Tsay et al. |

OTHER PUBLICATIONS

Ren, Yalin, Leung, Bosco H., Lin, Yuh-Min, "A Mismatch-Independent DNL Pipelined Analog-to-Digital Converter", IEEE Transactions on Circuits and Systems-II: Analog and Digital Signal Processing, vol. 46, No. 5, May 1999, pp. 517-526.

* cited by examiner

*Primary Examiner*—Jean B Jeanglaude
(74) *Attorney, Agent, or Firm*—Peter J. Meza; Hogan & Hartson LLP

(57) ABSTRACT

A single-pass method of trimming a network, and a network manufactured according to the method, uses the assumption that the peak INL value is minimized by trimming all the structures in the network to a same target value based upon the boundary conditions of the discretely adjustable elements that make up the structures. Using this assumption, the number of targets that need to be simulated, can be greatly reduced making estimation of peak INL possible in a reasonable amount of testing or manufacturing time. The trim algorithm produces results that are optimum or substantially close to optimum and is guaranteed not to deteriorate the Peak INL compared to the untrimmed Peak INL. An auto-calibration system using the trim method is also provided so that the method can be used in a product in real time if desired.

25 Claims, 13 Drawing Sheets

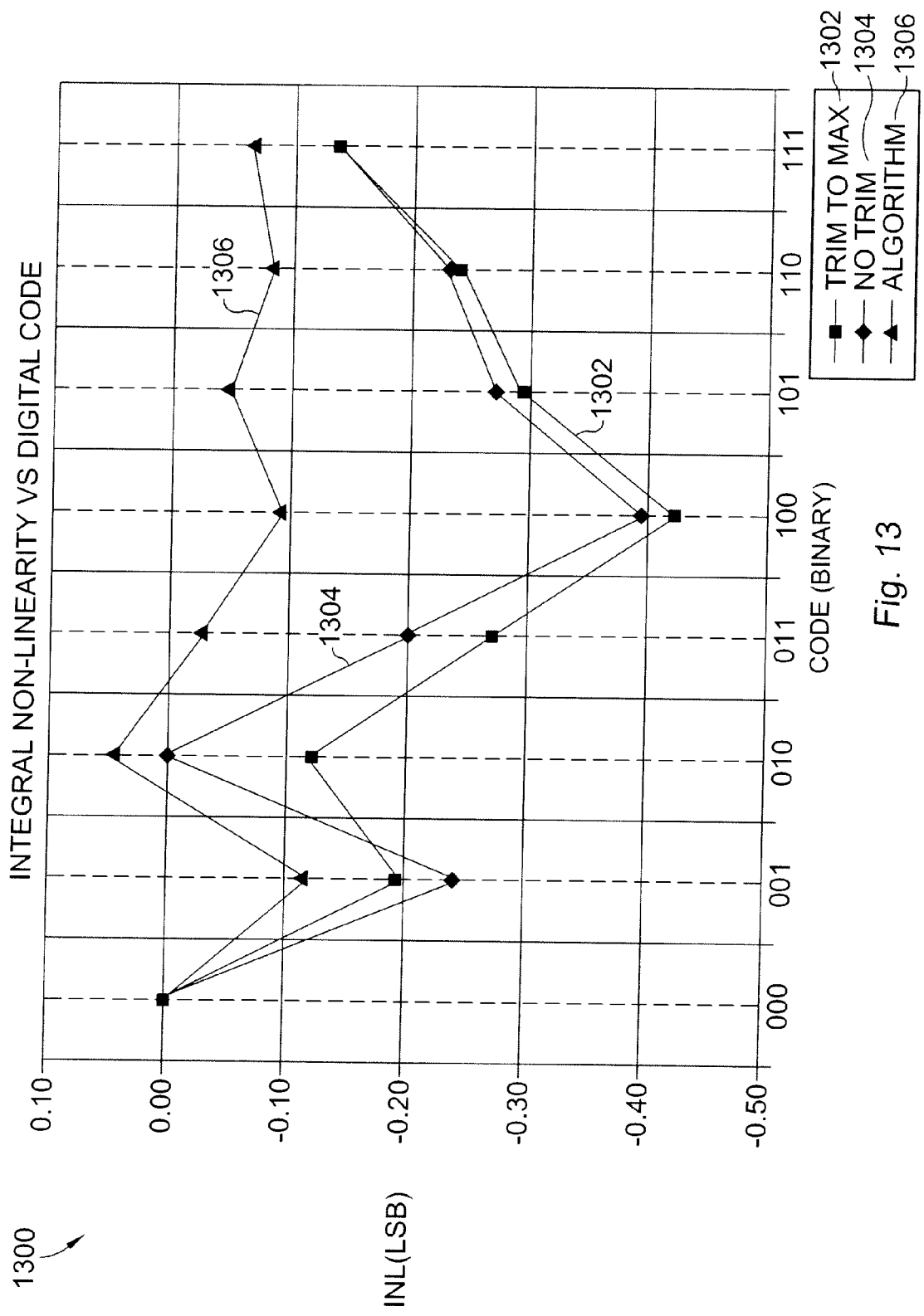

SINGLE PASS INL TRIM ALGORITHM FOR NETWORKS

TECHNICAL FIELD

The present invention relates to networks in general, and, more particularly, to a single pass linearity trim algorithm for resistor networks that can be implemented in a reasonable amount of time. One application where this algorithm can be utilized is a digital-to-analog converter that employs a resistor string network.

BACKGROUND OF THE INVENTION

A network that has one or more outputs that are proportional to a reference input is composed of identical structures. All the outputs have varying ratios with respect to the reference input. The linearity of such a network depends on the matching between the identical structures that the network is composed of. One common measure of linearity for this type of network is the Integral Non-Linearity (INL) Error. INL error of any output of the network is defined as the deviation of the actual value of the output from the ideal value of the output. Due to manufacturing tolerances of the identical structures comprised in the network, the linearity of the network may be degraded. One way to improve the linearity of the network is to construct the identical structures as pairs of one fixed element and one adjustable element. When the identical structures are constructed in this way, the adjustable elements can be varied or trimmed according to an algorithm so that the linearity of the network is improved.

A specific, non-limiting example of a possible network of this type is a resistor string network 100 as shown in FIG. 1. Resistor string networks have general utility in a variety of applications including, but not restricted to: Digital-to-Analog Converters; Analog-to-Digital Converters; Programmable Gain Amplifiers; Programmable Attenuators; Programmable Resistors; and more. The resistor string network 100 as shown in FIG. 1 is designed for an N-bit Digital-to-Analog Converter. Network 100 has $2^N$ identical resistive structures tied in series between REFHI node and REFLO node. The resistive structures in the resistor string network 100 are labeled R1, R2, R3, R4 through R_$2^N$-2, R_$2^N$-1, R_$2^N$. The reference input voltage is applied between REFHI and REFLO nodes. Each of the $2^N$ outputs V0, V1, . . . , V$2^N$-2, V$2^N$-1, has a specific and different ratio to the reference input voltage. For an N-Bit DAC, as N gets larger the number of resistive structures in the network grows exponentially. Due to this exponential growth, achieving good matching between the different resistive structures is difficult. For example, even if one of the resistive structures does not match all the other $2^N$-1 resistive structures, then almost all the outputs of the network deviate from their ideal value and each will end up with a non-zero Integral Nonlinearity (INL) error. Thus, in order to get low INL errors, this type of network requires that the resistive structures are constructed as pairs of one fixed element and one adjustable element, where the resistance of the adjustable elements can be trimmed and INL errors can be reduced.

FIG. 2 depicts a resistor string network 200, wherein the identical resistive structures 202 are constructed as a parallel combination of one fixed element 203 and one adjustable element 204. It will be apparent to those skilled in the art that the one fixed element 203 may be constructed as a series, parallel or series/parallel combination of one or more fixed units. It will also be apparent to those skilled in the art that the one adjustable element 204 may be constructed as a series, parallel or series/parallel combination of one or more adjustable units. Furthermore pairs of one fixed element and one adjustable element can be constructed as a series, parallel or series/parallel combination of one or more fixed units and one or more adjustable units. Both the adjustable elements and the adjustable units can be either unidirectional or bidirectional. The value of unidirectional adjustable elements can only be either increased (trim-up) or decreased (trim-down) and they are usually constructed using one or more unidirectional adjustable units. On the other hand the value of bidirectional adjustable elements can be both increased (trim-up) and decreased (trim-down). Bidirectional adjustable elements can be constructed using one or more bidirectional adjustable units, one or more unidirectional adjustable units or a combination of one or more bidirectional adjustable units and one or more unidirectional adjustable units. Furthermore both the bidirectional and unidirectional adjustable elements can be either continuously adjustable elements or discretely adjustable elements. Continuously adjustable elements allow the value of the adjustable element to change by any finite amount, while the discretely adjustable elements only allow changes in the value of the adjustable element by discrete steps.

Usually, it is more efficient to design unidirectional (either trim up only or trim down only) trim structures. The adjustable elements 204 shown in FIG. 2 are of the type unidirectional (trim-up) continuously adjustable elements. One algorithm that is used to trim the resistor string network 200 composed of this type of adjustable elements is to first measure all the outputs of the network V0,V1,V2 through V$2^N$-2,V$2^N$-1, determine the resistive structure 202 with the maximum resistance from the measurement data, and then trim up all the other resistive structures 202 to this maximum resistance value. There exist a few problems with the implementation of this algorithm. One challenge is the fact that trims are interactive when the string network 200 is driven with a constant voltage reference source which is the case for the normal operation of the part. In other words, trimming one resistive structure affects all the outputs which makes it very complicated to deduce whether or not the resistive structure is trimmed to the target value.

In order to mitigate the problem discussed with respect to FIG. 2, the resistor string network 300 may be driven by a constant current source instead of a voltage source as is shown in FIG. 3. Using a current source reduces the interaction between trims. However the overall trim procedure still requires multiple passes, which means the trim cannot be completed without making additional output measurements. This is necessary because for continuously adjustable elements one has to measure the output after each trim operation to see if the resistive structure being trimmed has reached the target value. In addition to this, the current sources have by nature high output impedances that may cause long settling times for the outputs. All these effects, undesirably increase trim time.

What is desired, therefore, is a method for trimming a network that can be accomplished with a single pass (in other words with no additional output measurements except for the initial measurements), within a reasonable amount of trim time, and does not suffer from the problems associated with the prior art discussed above.

SUMMARY OF THE INVENTION

According to the present invention a single-pass method of trimming a network, and a network manufactured according to the method, uses discretely adjustable elements that change the value of the structures in the network by a predetermined amount and an algorithm that attempts to find a configuration of these discretely adjustable elements that minimizes the Peak-INL. The algorithm of the present invention tries various trim targets and picks the target that yields the minimum peak INL. The algorithm uses the assumption that the peak INL value is minimized by trimming all the structures in the network to a same target value. With this basic assumption, the number of targets can be greatly reduced making trimming of peak INL possible in a reasonable amount of testing time. The trim algorithm according to the present invention in most cases produces results that are optimum or substantially close to optimum and is guaranteed not to deteriorate the Peak INL compared to the untrimmed Peak INL.

According to the present invention, the method includes providing a resistor string network for an N-Bit DAC with $2^N$ resistive structures constructed as pairs of one fixed element and one discretely adjustable element, each discretely adjustable element having at least one boundary condition, selecting a plurality of resistance targets based upon the at least one boundary condition, each target resulting in a different trim code, calculating a peak INL for each trim code, selecting the trim code that yields the minimum peak INL, and trimming the resistor string network to the selected trim code. In the trim method of the present invention, all of the resistive structures in the resistor string network are trimmed to the same target value. A plurality of resistance targets for each resistive structure in the network is selected. The number of resistance targets is equal to $(2^M-1)*2^N$ wherein $(2^M-1)$ represents the number of targets for each M-Bit Binary weighted discretely adjustable element and $2^N$ represents the total number of resistive structures. According to the method of the present invention, the resistive structures are trimmed such that the trimmed value of the resistive structure is as close as possible to the target value that the resistive structure is trimmed to. In the method of the present invention, the peak INL of the trimmed network is always less than or equal to the peak INL of an untrimmed network.

According to the present invention an auto-calibration system is also provided including a Digital-to-Analog Converter having a digital input and an analog output, and including an N-bit resistor string network with $2^N$ resistive structures constructed as pairs of one fixed element and one discretely adjustable element, each discretely adjustable element having at least one boundary condition, an ADC having an analog input coupled to the analog output of the DAC, and a digital output, and a microprocessor having an input coupled to the digital output of the ADC and an output for providing trim codes to the DAC, wherein the trim codes are determined by the boundary conditions of discretely adjustable elements in the N-bit resistor string network. In the auto calibration system of the present invention the trim codes are periodically updated, updated when a performance parameter drops below an acceptable limit, or updated as desired by an end user.

BRIEF DESCRIPTION OF THE DRAWINGS

The present invention is illustrated by way of example and not by limitation in the accompanying figures in which like reference numerals indicate similar elements and in which:

FIG. 13 is an INL plot of the DAC shown in FIG. 8 for the no trim, trimmed to maximum resistor value, and trimmed according to the trim algorithm of the present invention cases.

DETAILED DESCRIPTION

Figure 1:
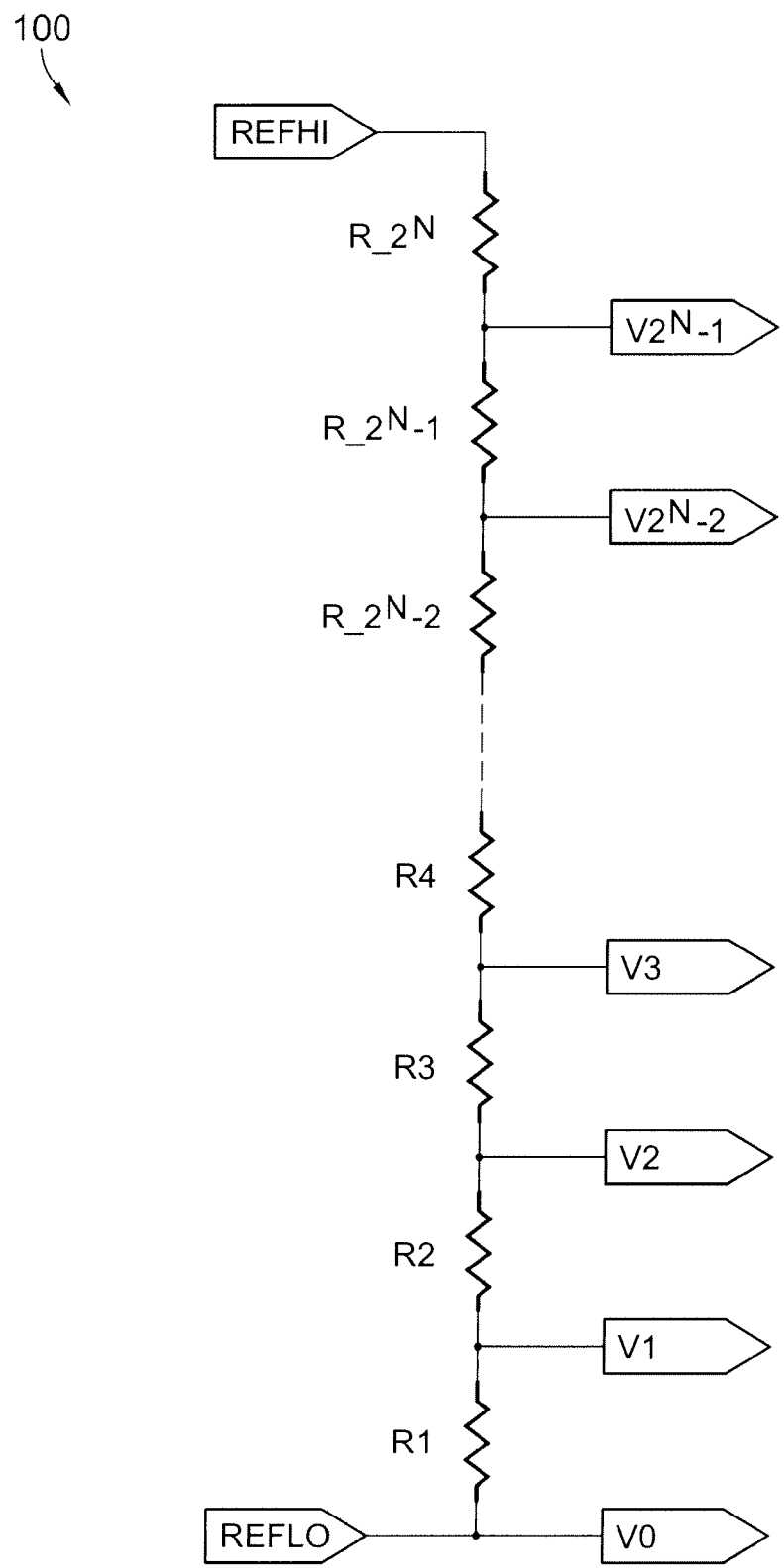
FIG. 1 is a schematic diagram of a resistor string network for an N-Bit DAC with $2^N$ resistive structures according to the prior art.
Figure 2:
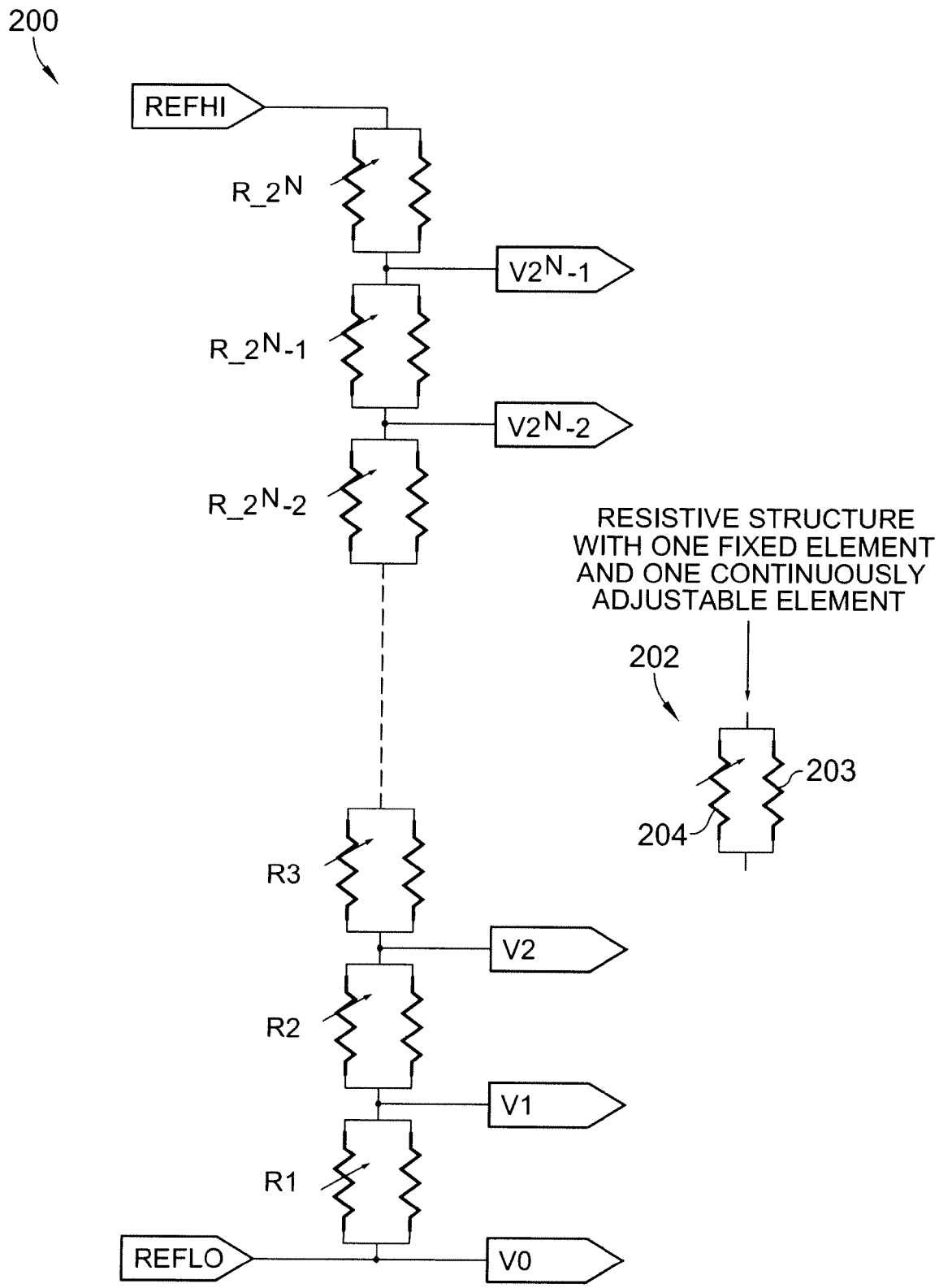
FIG. 2 is a schematic diagram of a resistor string network for an N-Bit DAC with $2^N$ resistive structures that are constructed as pairs of one fixed element and one continuously adjustable element according to the prior art.
Figure 3:
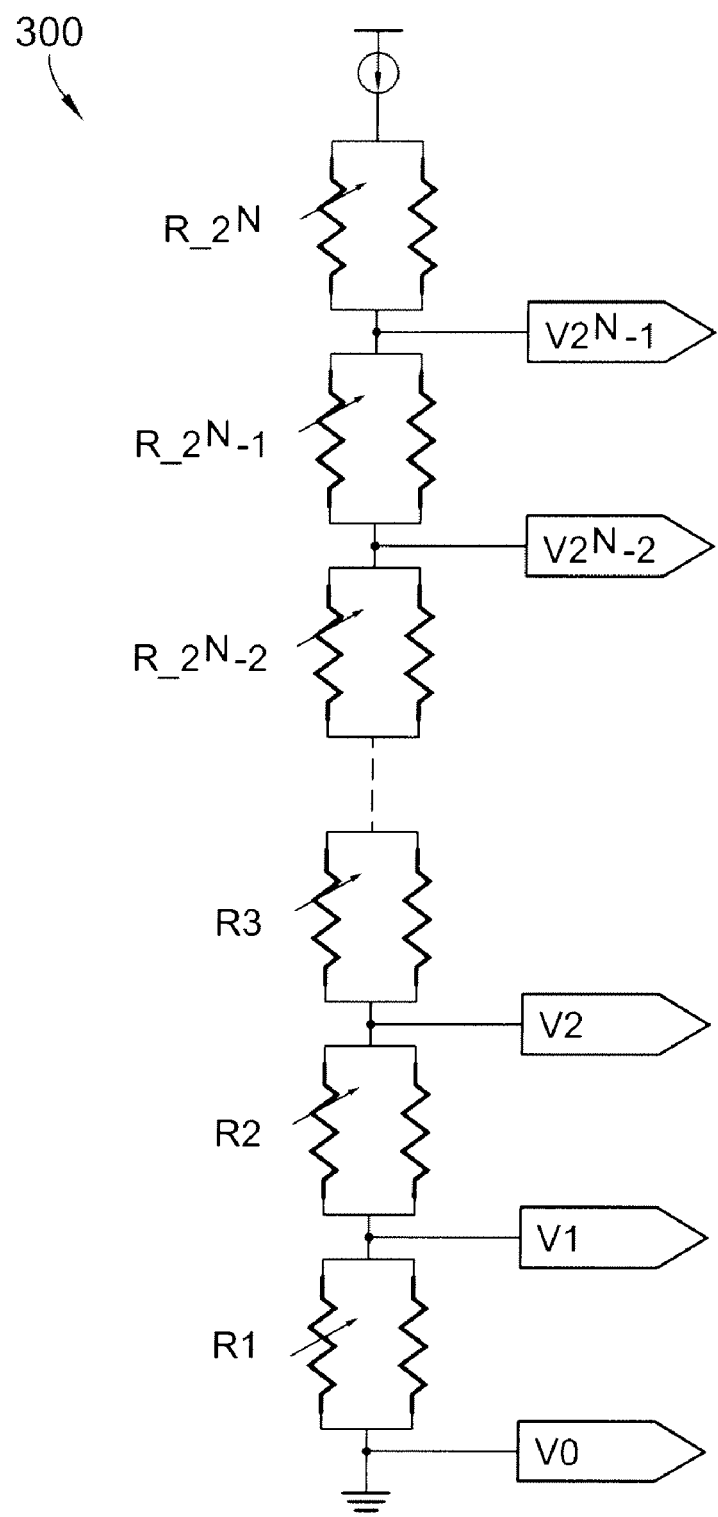
FIG. 3 is a schematic diagram of a resistor string network for an N-Bit DAC with $2^N$ resistive structures that are constructed as pairs of one fixed element and one continuously adjustable element being driven by a current source to reduce trim interactions according to the prior art.
Figure 4:
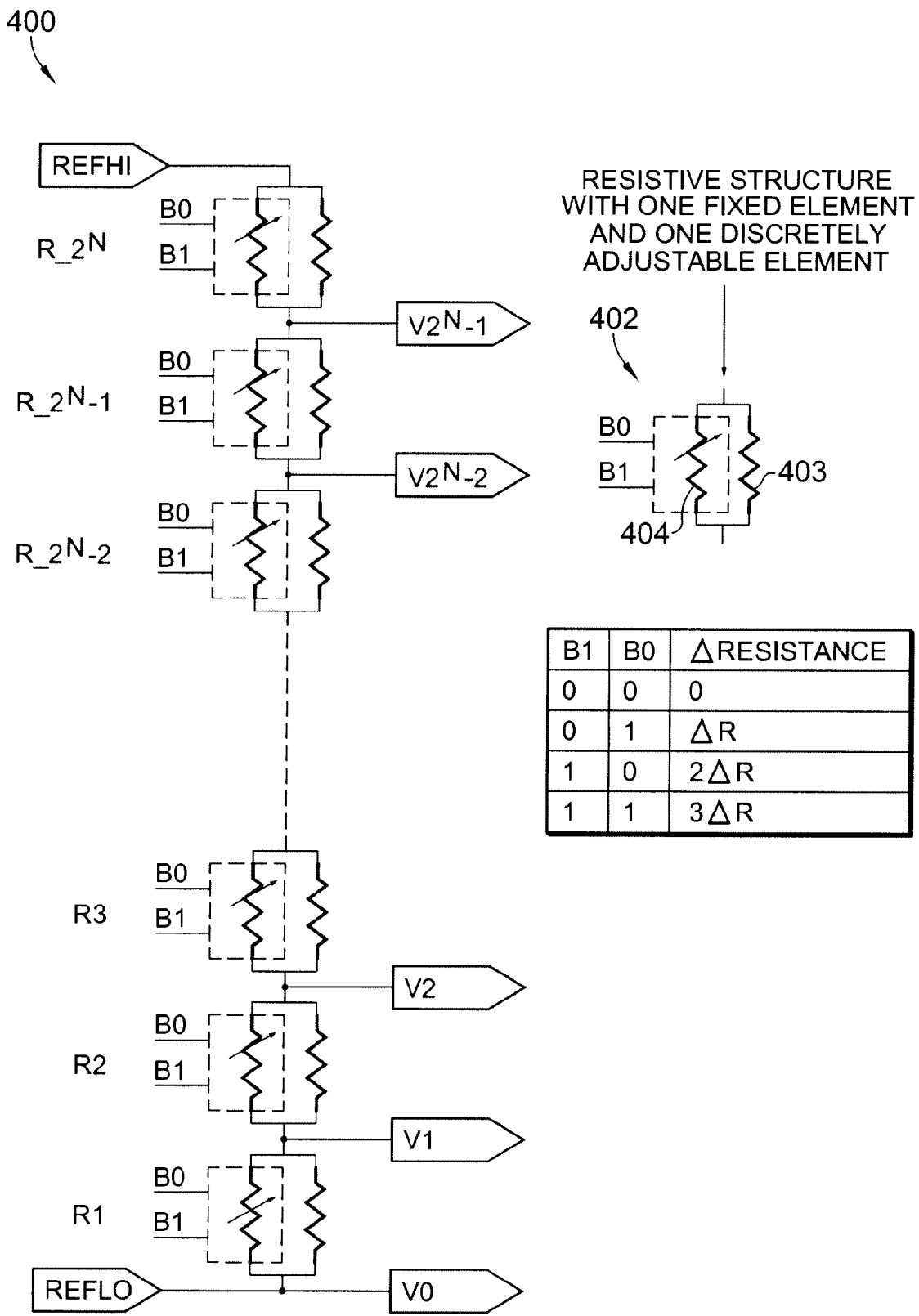
FIG. 4 is a schematic diagram of a resistor string network for an N-Bit DAC with $2^N$ resistive structures that are constructed as pairs of one fixed element and one 2-Bit binary weighted discretely adjustable element that can be trimmed according to the method of the present invention.

Referring now to FIG. 4, a schematic diagram of a resistor string network 400 for an N-Bit DAC with $2^N$ identical resistive structures 402 that is constructed using a fixed element 403 and a unidirectional discretely adjustable element 404 that can be trimmed according to the present invention is shown. As depicted in FIG. 4, the solution to trimming in a single pass is to have discretely adjustable elements that change the value of the resistive structure by a pre-determined, discrete amount, rather than a continuously adjustable element which allows to change the value of the resistive structure by any finite amount. The discretely adjustable elements are elements that can only assume a predetermined number of values. These values can be thought of as the states that the element can be in. A non-limiting example of a discretely adjustable element is a digitally controlled resistor where a digital word controls the value (state) of the resistor. One way to implement digitally controlled resistor is to have trim resistors in parallel with a main resistor that can be switched off using transistor switches or cut open using laser trimming. It will readily be apparent to those skilled in the art that the discrete weight adjustable element may be adjusted by a variety of means including but not limited to: laser trimming, using transistor switches, fuse link trimming, anti-fuse link trimming, PROM control, programmable logic and more.

The discretely adjustable element 404 in FIG. 4 is controlled by two digital bits B0 and B1. The table in FIG. 4 shows the digital bit values for the B0 and B1 digital inputs and the resultant change in the resistance of the resistive structure. For B0 and B1 both 0, the resistance of the resistive structure is the untrimmed, nominal value. Taking B0 only high results in a change in the nominal value of the resistive structure by $\Delta R$. Taking B1 only high results in a change in the nominal value of the resistive structure by $2\Delta R$. Taking B0 and B1 both high results in a change in the nominal value of the resistive structure by $3\Delta R$. This is an example of unidirectional binary weighted discretely adjustable element as the resistance can only be increased (unidirectional) compared to the untrimmed value and the increase due to B1 is two times (binary weighted) the increase due to B0.

The challenge with the discretely adjustable elements that are shown in FIG. 4 is to determine the target resistance that minimizes the Peak Integral Nonlinearity Error of the whole network. One solution suggested by prior art is choosing as trim target the maximum resistance value of the resistive structures R1, R2, ..., R_$2^N$. However choosing the maximum resistance value as the target value does not necessarily minimize the Peak INL as the resistive structures can not always be made exactly equal to the resistive structure with the maximum resistance. Because of this, each resistive structure may have either a slightly less or slightly high resistance value than the resistive structure that has the maximum resistance value. If the resistive structures that have slightly less resistance value happen to be adjacent in the string network, than their errors will accumulate to cause a large negative INL error. Conversely if the resistive structures that have slightly higher resistance value happen to be adjacent in the string than their errors will accumulate to cause a large positive INL.

One advantage with discretely adjustable elements of the type shown in FIG. 4 is the fact that any trim combination can easily be simulated and the results can be predicted. Thus, by simulating all the trim combinations and predicting the results of each, the optimum trim combination may be found and all the resistive structures may be trimmed in a single pass. Unfortunately for typical cases, the total number of trim combinations may be exceedingly high and thus simulating all combinations is not feasible.

Figure 5:
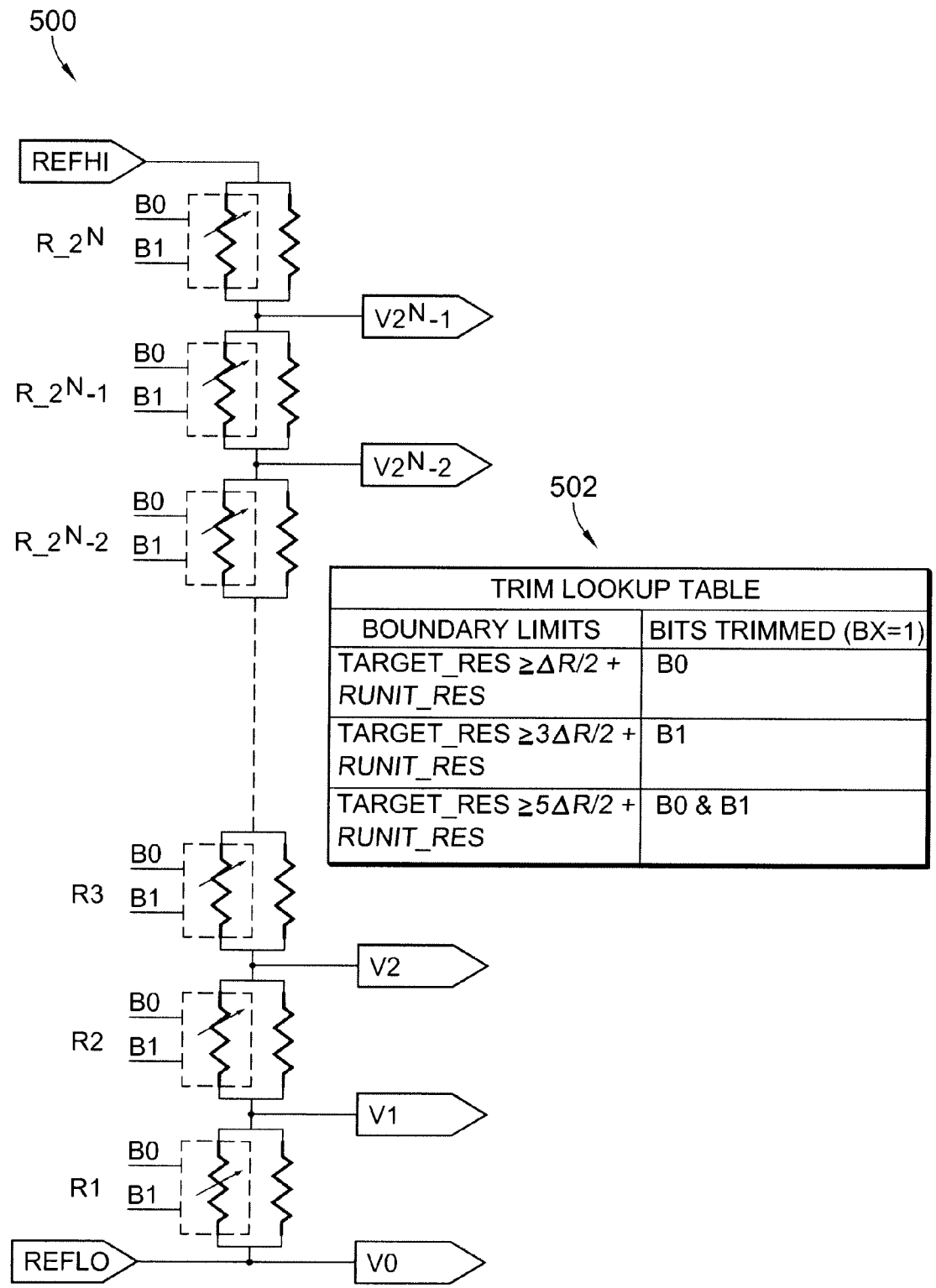
FIG. 5 is a schematic diagram of the resistor string network of FIG. 4 and a corresponding trim look-up table for the discretely adjustable elements according to the present invention.

The algorithm according to the present invention depicted in FIG. 5 tries to eliminate the number of trim combinations that need to be simulated for resistor string network 500. The heuristic approach used for the algorithm of the present invention resides in the assumption that trimming all resistive structures R1 through R_$2^N$ in the network to the same target value will yield minimum or sufficiently close to minimum peak INL error. Assuming a 2-Bit binary weighted discretely adjustable element per resistive structure with one bit changing the resistance by $\Delta R$ and the other by $2\Delta R$, the resulting trim look up table is shown in FIG. 5. As can be seen from the table, for M Binary weighted discretely adjustable elements there are $2^M-1$ different trim boundary conditions that yield a different trim combination. For all the resistive structures that are trimmed ($2^N$ for a string network used in an N-Bit DAC), the total number of trim targets that yield different trim combinations is $(2^{N+M}-2^N)$ which is much lower than $2^{2^N \times M}$ (all the possible trim combinations) for most practical cases. In general, the discretely adjustable elements do not need to be binary weighted. Due to practical implementation considerations they can be of equal weight or may be weighted by a factor other than 2. This only affects the number and value of the boundary conditions and the trim algorithm is still applicable to architectures that include these types of adjustable elements.

Figure 6:
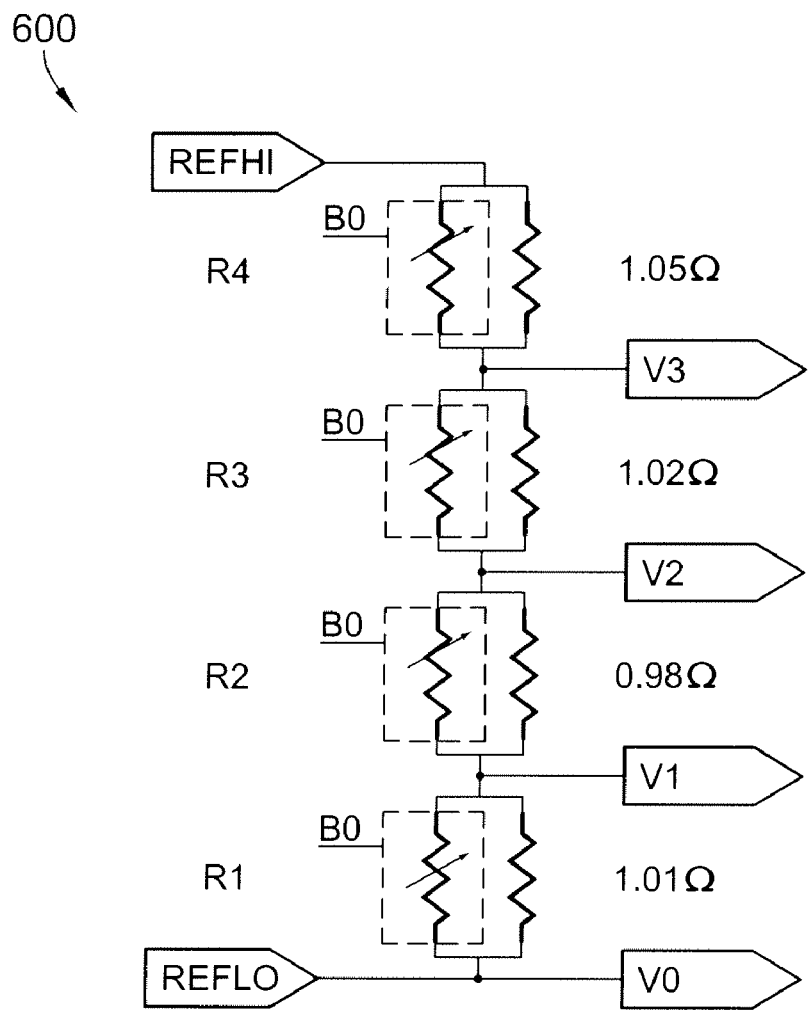
FIG. 6 is an example of a resistor string network for a 2-bit DAC with 4 resistive structures that are constructed as pairs of one fixed element and one 1-Bit discretely adjustable element that can be trimmed according to the present invention.

Referring now to FIG. 6, an example of a resistor string network designed for a 2-bit DAC 600 is shown where a 1-Bit discretely adjustable element is used. FIG. 6 shows a simple example trim where the number of trim codes to try in the trim algorithm according to the present invention is reduced from 16 to 4. As this trim is digital in nature (ON/OFF type) it can be implemented with a digital controller and may even be changed on the fly as an auto calibration routine. In the example of FIG. 6, the nominal value for R1 is $1.01\Omega$, the nominal value for R2 is $0.98\Omega$, the nominal value for R3 is $1.02\Omega$, the nominal value for R4 is $1.05\Omega$, and the nominal value for the change in resistance due to the 1-bit trim is $0.10\Omega$. In the example of FIG. 6, according to the proposed algorithm the only targets that need to be simulated for the resistor string network shown are the four boundary limits in the table, i.e. $1.06\Omega$, $1.03\Omega$, $1.07\Omega$, and $1.10\Omega$. Any target in between the limits would result in the same trim code as the lower limit since all resistive structures are trimmed to the same target. Thus, in the example of FIG. 6 only four trim codes are simulated instead of the $2^4=16$ total possible combinations.

Figure 7:
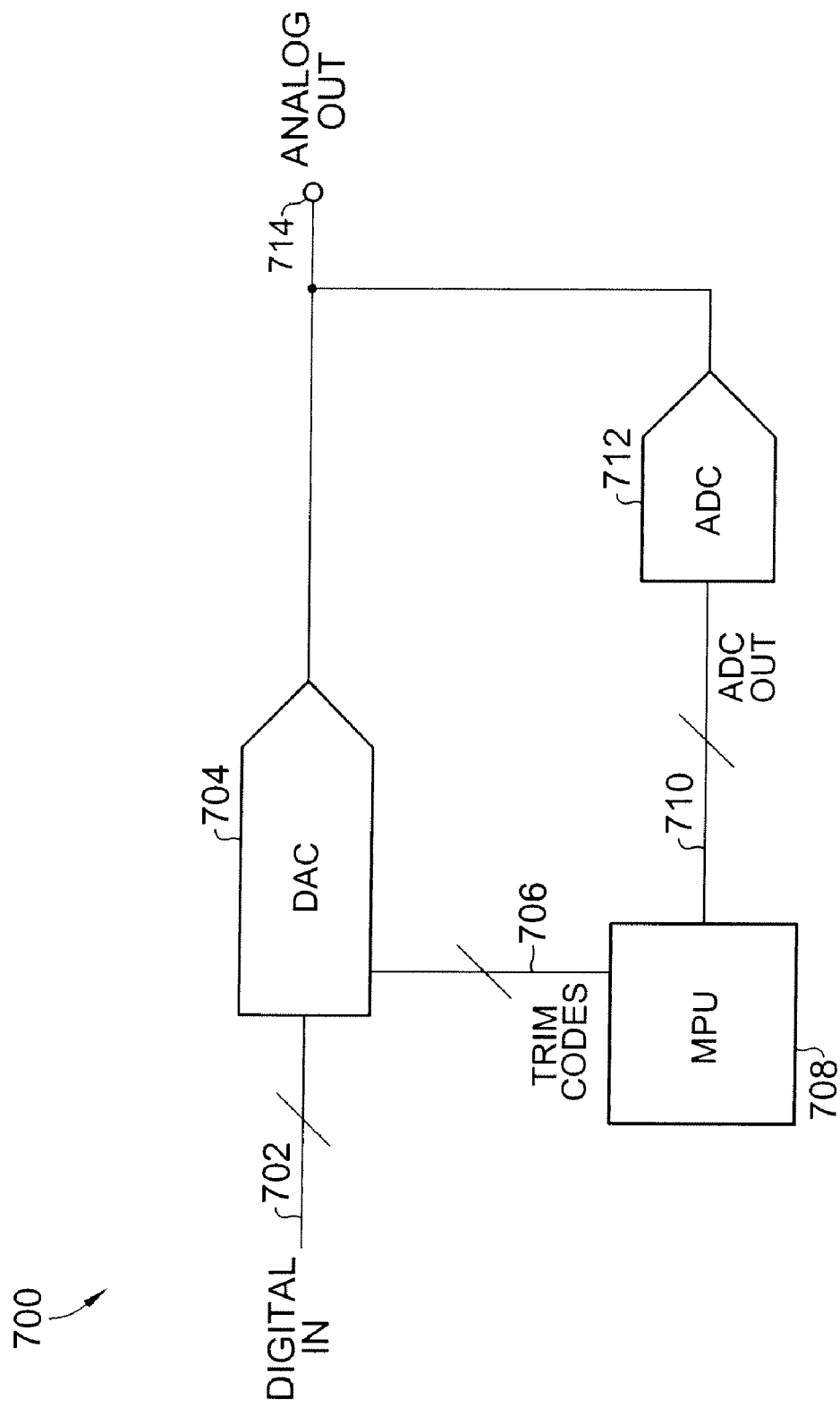
FIG. 7 is a schematic diagram of an auto-calibration system using the trim algorithm according to the present invention.

The trim algorithm according to the present invention is described in further detail below. Before the further detailed description it should be noted that the trim algorithm of the present invention can be used not only for improving the linearity of networks but could also be used as an auto-calibrate feature and incorporated into an application where the network is employed. One application where such a network can be employed is a digital-to-analog (DAC) converter. As is known in the art, the performance of DACs, like many analog and mixed analog/digital integrated circuits can suffer from ageing, post-packing shifts, and temperature variations. Referring now to FIG. 7, a schematic diagram of an auto-calibration system 700 is shown using the trim algorithm according to the present invention. DAC 704 receives the digital input on bus 702 and provides an analog output at node 714. The analog output 714 is received by ADC (Analog-to-Digital Converter) 712, which provides a digital output on bus 710. Microprocessor 708 receives the digital output and provides trim codes on bus 706 to DAC 704. The actual method of providing the trim codes proceeds as described above and is further described in detail below. The auto-calibration system 700 shown in FIG. 7 can be periodically updated, updated when a performance parameter drops below an acceptable limit, or can be updated as desired by the end user.

Figure 8:
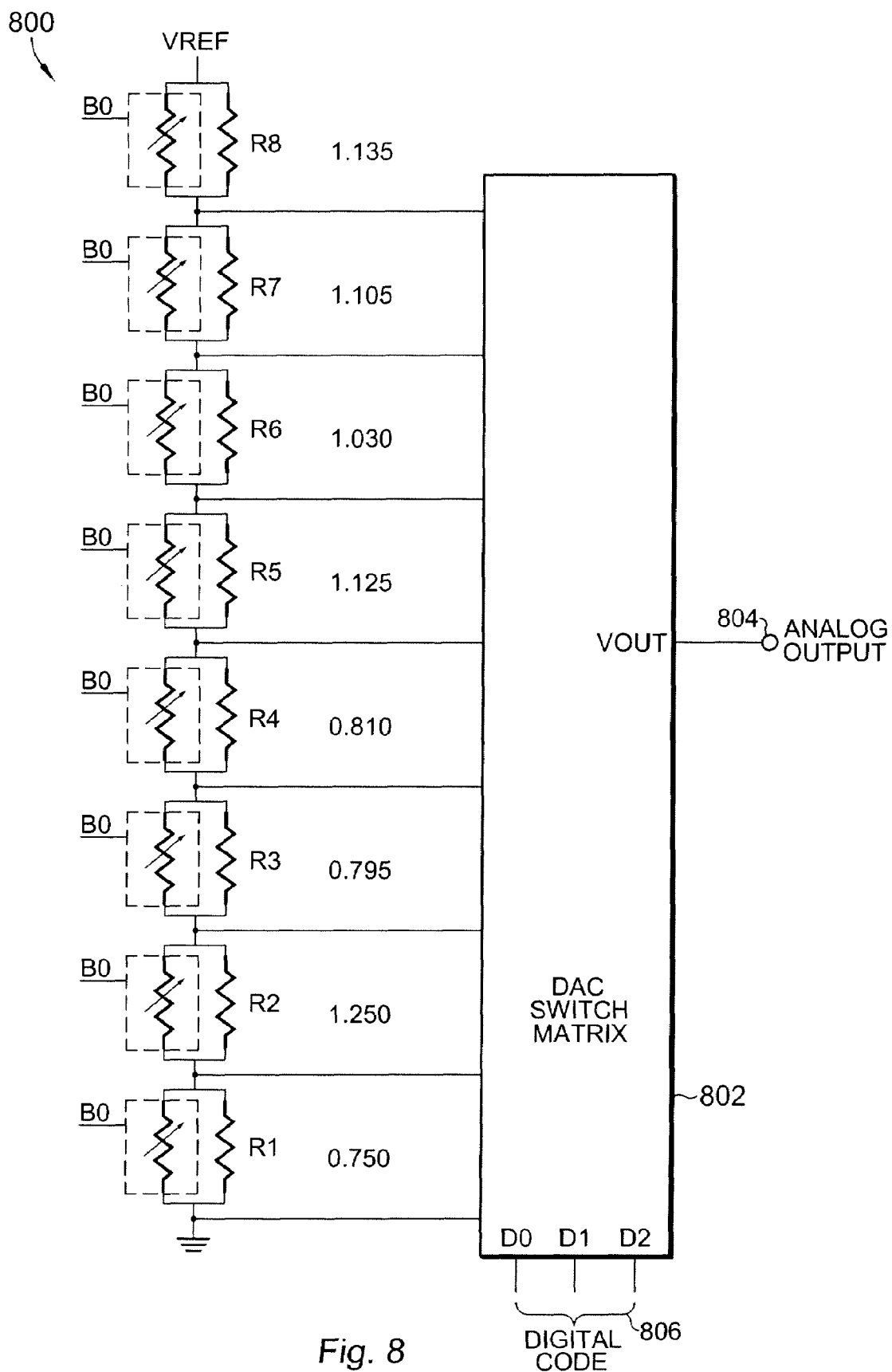
FIG. 8 is a schematic diagram of a 3-bit DAC employing a resistor string network with 8 resistive structures that are constructed as pairs of one fixed element and one 1-Bit discretely adjustable element that can be trimmed according to the present invention.

The trim algorithm of the present invention is now described in further detail with reference to a specific example. FIG. 8 depicts a 3-Bit Digital to Analog Converter (DAC) 800 that employs a resistor string network. The eight resistive structures R1-R8 are tied in series between a High Reference Voltage (VREF) and a Low Reference Voltage (GND). The outputs of this resistor string network are then multiplexed to a single DAC output by the DAC switch matrix 802, controlled by the 3-Bit Digital Code 806. According to the code, only one of the outputs of the resistor string network is connected to the analog output and digital-to-analog conversion is realized. For example, for Digital Code 3 (Binary 011) the top of resistor R3 (or bottom of resistor R4) is tied to the analog output 804. Ideally, all the resistive structures in the string network should have the same value. If this is the case, the DAC 800 will have Zero Integral Non Linearity (INL) Error. However, due to the imperfections in production, it is almost impossible to have a string network with resistive structures that all have the same value. Because of this reason, the DAC will have a Non-Zero INL error.

Figure 9:
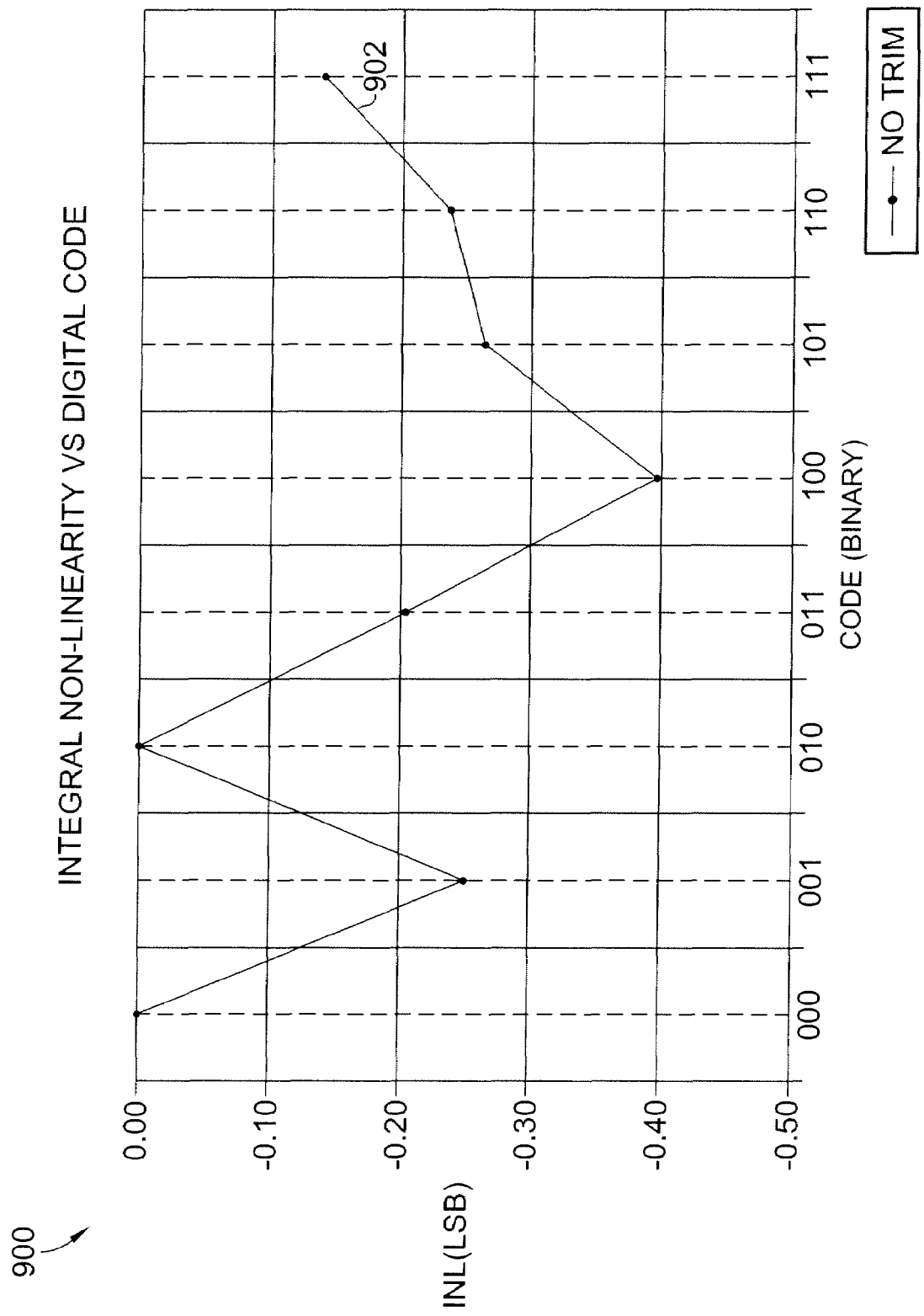
FIG. 9 is an INL plot for the DAC shown in FIG. 8 according to the present invention.

The DAC in FIG. 8 employs a resistor string network that has resistive structures with varying values. The resulting INL plot due to the different values of resistive structures is shown in FIG. 9. The INL error is defined as the deviation of the analog output from its ideal value. The INL error 902 for this DAC at code 1 (binary 001) is −0.25 Least Significant Bits (LSBs). The LSB here refers to the smallest step size that the DAC can produce. For Example a 3-Bit DAC has $2^3$=8 total steps. Thus, the smallest step size that the DAC can produce is VREF/8 which is the LSB size. An INL value of −0.25 at code 1 means that the actual analog output at code 1 is less than the ideal value of code 1 by an amount that is equal to 25% of the LSB size of the DAC. This error can be calculated as is described below.

The actual output at code 1 is equal to VREF*(R1/Rtotal), where Rtotal is the sum of all the resistances of resistive structures (R1 to R8) in the string. The Ideal Value at any code is given by VREF*(Code/$2^3$), so at code 1 the Ideal Value is equal to VREF*(⅛). Thus, the INL error is equal to [VREF* (0.75)/8]−[VREF*(⅛)]=VREF*(−0.25)/8. In order to express the INL error in LSBs, the INL error needs to be divided by the LSB size which is VREF/8. Thus, [VREF*(−0.25)/8]/[VREF/8]=−0.25. The advantage of expressing the INL error in units of LSB is the fact that the INL values remain constant for different VREF voltages.

To overcome the INL error caused by the unequal resistive structure values, the adjustable element in the resistive structure may be trimmed post production. One way to trim suggested by prior art is to have unidirectional continuously adjustable elements that allow the resistance to be trimmed up (increases the value) only. The disadvantages of this trim method were previously discussed. In order to be able to trim in a single pass, discretely adjustable elements are a better choice. A "single pass" refers to being able to trim the resistor string network all at once without making any intermediate measurements. In other words trimming the resistor string network and then making measurements and then followed by an additional trim would be considered multiple pass. Single pass refers to making initial measurements of the resistor string network and then trimming whatever needs to be trimmed and then the trimming is completed.

The resistive structures in the DAC shown in FIG. 8 incorporate 1-Bit discretely adjustable elements. Each discretely adjustable element is controlled by a single digital bit "B0" that increases the value of the corresponding resistive structure by 0.2Ω (trim weight) when its controlling bit is 1, or does not change the value of the resistive structure at all when its controlling bit is 0. For example the untrimmed value (B0=0) of resistive structure R5 in FIG. 8 is 1.125Ω and when it is trimmed (B0=1) it goes up to 1.325Ω. For this type of trim, the decision to trim or not, depends on the target value chosen for each resistive structure being trimmed. For example if R6 in FIG. 8 is trimmed to a target value of 1.1Ω, B0=0 because the untrimmed value of R6 is 1.03Ω, which is 0.07Ω less than the target. If R6 (B0=1) is trimmed, its value would go up to 1.23Ω which is 0.13Ω more than the target. Since the untrimmed value is closer to the target value, B0 for R6 should be 0 if the target is 1.1Ω. For the case of 1-Bit discretely adjustable elements (M=1), the rule for trimming according to the present invention is as follows: If TARGET VALUE−TRIM WEIGHT/2≧RESISTANCE OF RESISTIVE STRUCTURE BEING TRIMMED then B0=1 (Resistive structure needs to be trimmed) else TARGET VALUE−TRIM WEIGHT/2<RESISTANCE OF RESISTIVE STRUCTURE BEING TRIMMED then B0=0 and the resistive structure shouldn't be trimmed. Thus, if the target value is larger than the resistance of the resistive structure being trimmed, by an amount that is greater than or equal to half the trim weight size, than the resistive structure should be trimmed. Otherwise the resistive structure shouldn't be trimmed. Similar look-up tables can be generated for multi-bit discretely adjustable elements. A look-up table is shown for a 2-Bit Binary weighted discretely adjustable element in FIG. 5, previously discussed. In an actual implementation according to an embodiment of the invention 3-Bit binary weighted discretely adjustable elements have been used.

An advantage of the trim algorithm of the present invention, as previously mentioned is the fact that different trim combinations can be simulated easily and the resulting Peak INL value can be estimated. Once the resulting Peak INL for each trim combination is known, the trim combination that yields the minimum Peak INL can be found and the network can be trimmed to that trim combination. Peak INL here refers to the maximum deviation of the INL plot from zero in either direction (positive or negative). For example, if the maximum INL of a network is 0.48 LSBs and the minimum INL is −0.64 LSBs, then the Peak INL for the network is 0.64 LSBs as a −0.64 LSB deviation is larger than a 0.48 LSB deviation.

Unfortunately, in most cases simulating all the trim combinations may not be feasible. For example in the actual implementation of an embodiment of the present invention, a 5-Bit DAC that has 32 resistive structures with 3-Bit binary weighted discretely adjustable elements is used. The total number of trim combinations for this architecture is $2^{96}$=7.9E28. It is impossible to simulate this many combinations in any mass production environment. Thus an algorithm is needed to reduce the number of combinations that need to be simulated. As mentioned before if all the resistive structures in the string network have the same value, the DAC has Zero INL error. So the first thing that is done to reduce the number of trim combinations is to trim all resistive structures to the same target value. However this alone does not reduce the number of trim combinations, as infinitely many target values may be chosen to be simulated. Thus another rule is needed to assist in choosing the trim targets that are to be simulated. The approach of the trim algorithm of the present invention is to simulate only those trim targets that yield different trim codes. The trim code is the digital word that is used to trim the network. For example, a trim code of 01101010 for the DAC in FIG. 8 refers to the case where resistive structures R2, R3, R5, R7 are trimmed (their B0's=1) and resistive structures R1, R4, R6, R8 are not trimmed (their B0's=0). This rule is important because if targets are chosen that yield the same trim codes, simulating them is not efficient. This is because the same trim codes yield the same Peak INL and this does not help in the effort for finding the trim code that yields the minimum Peak INL error. Thus the two main rules of the algorithm according to the present invention are as follows:

1) Trim all identical structures in the network to the same target value.

2) Choose trim targets that yield different trim codes.

Once all the trim targets are chosen, the Peak INL for each trim target can be calculated and the trim code that yields the minimum Peak INL can be chosen. All that remains is to trim the network to that chosen trim code.

Figure 10:
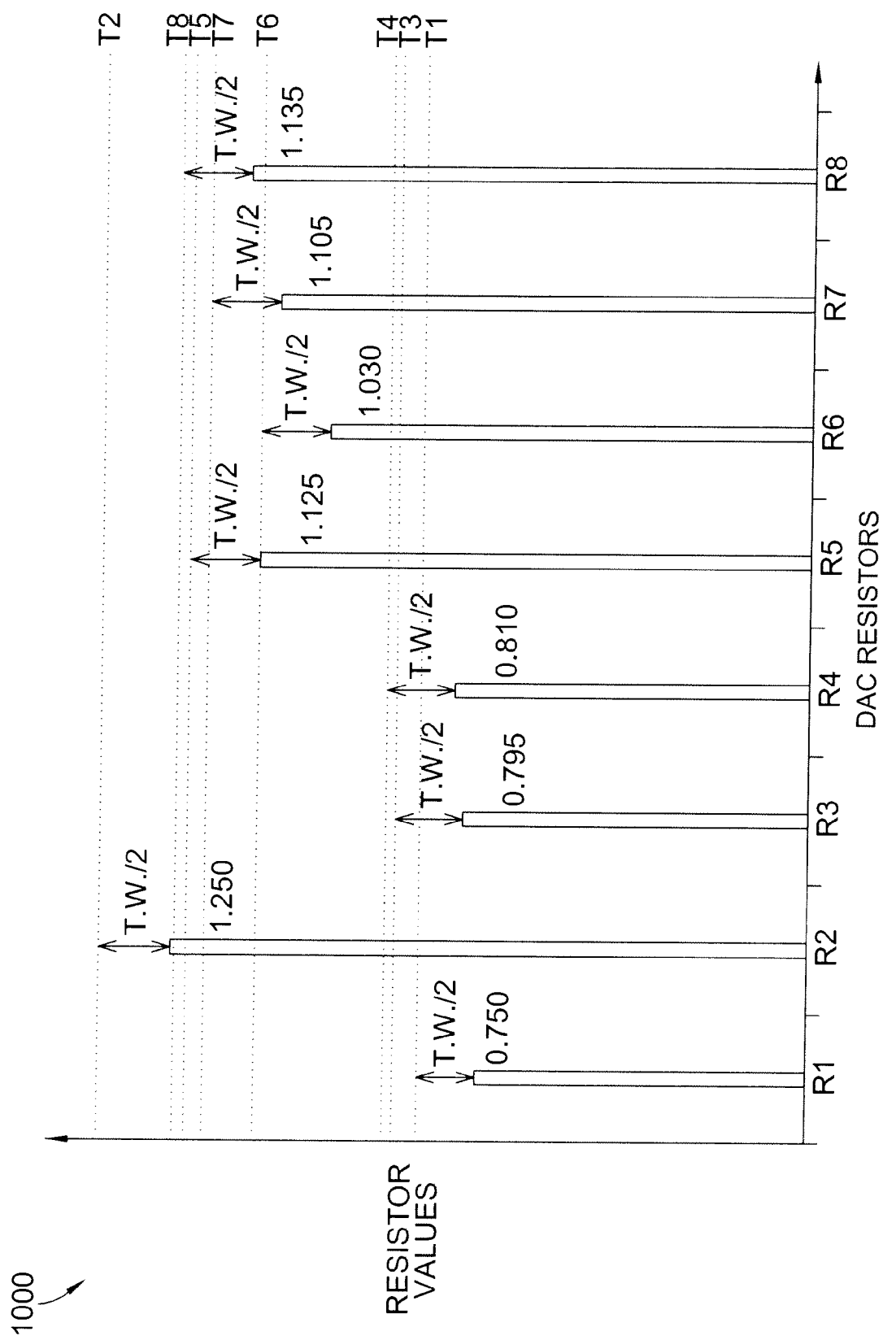
FIG. 10 is a resistor bar plot for the DAC shown in FIG. 8 and the trim targets simulated by the trim algorithm according to the present invention.

The above discussed rules are now applied to the specific example of the DAC shown in FIG. 8. The plot of FIG. 10 depicts how the trim targets are chosen for the DAC in FIG. 8. The plot 1000 is a resistor bar plot, where the height of each bar corresponds to the resistance of a resistive structure in the string network. The dashed horizontal lines indicate the trim targets T1-T8 chosen by the algorithm that are going to be simulated. The first target chosen by the algorithm is T1.

What is significant about T1 is the fact that it is exactly Trim Weight/2 higher than the resistance of R1. Recalling the rule for trimming, the target has to be at least Trim Weight/2 higher than the resistance of the resistive structure being trimmed. Thus if T1 is chosen as our target, resistive structure R1 is trimmed. Since R1 is the resistive structure with the lowest value, the trim code for this target is going to be 10000000, which means only R1 will be trimmed since T1 is not higher than any resistive structure by an amount that is greater than or equal to Trim Weight/2, except R1. Any target less than T1 will yield a trim code of 00000000 which is an untrimmed DAC since targets below T1 are not larger than any resistive structure by an amount that is greater than or equal to Trim Weight/2. Since the Peak INL for the untrimmed DAC is already known, there is no need to simulate any target below T1. Thus T1 is the first target to be simulated. Target values between T1 and T3 all yield the trim code 10000000 which is no different than T1, so they shouldn't be simulated. T3 is a Trim Weight/2 higher than the resistance of resistive structure R3, thus it should be simulated. The resulting trim code is 10100000 which is different than 10000000. As can be seen from the plot in FIG. 10, the targets are chosen by adding a Trim Weight/2 to each resistive structure's resistance value. This guarantees that the trim code for each target is different. The special significance about Trim Weight/2 is the fact that it is a boundary condition for trimming. If the distance between the target line and resistor bar is greater than or equal to Trim Weight/2 than the resistive structure is trimmed, otherwise it is not. Even though the example shown in FIG. 10 is for a 1-Bit discretely adjustable element with 1 boundary condition, the same target generation can be applied to multi-bit discretely adjustable elements. For M-bit binary weighted discretely adjustable elements there are $2^M-1$ boundary conditions, thus $2^M-1$ targets need to be simulated for each resistive structure. In the actual implementation a 3-Bit binary weighted discretely adjustable element is used that has $2^3-1=7$ boundary conditions, thus seven targets are simulated for each resistive structure that is to be trimmed.

Below is a table showing the Peak INL for all the trim targets that are simulated for the DAC in FIG. 8:

| TARGET | PEAK INL(LSBs) |
| --- | --- |
| UNTRIMMED | 0.40 |
| T1 | 0.29 |
| T2 | 0.33 |
| T3 | 0.19 |
| T4 | 0.12 |
| T5 | 0.34 |
| T6 | 0.18 |
| T7 | 0.26 |
| T8 | 0.42 |

Figure 11:
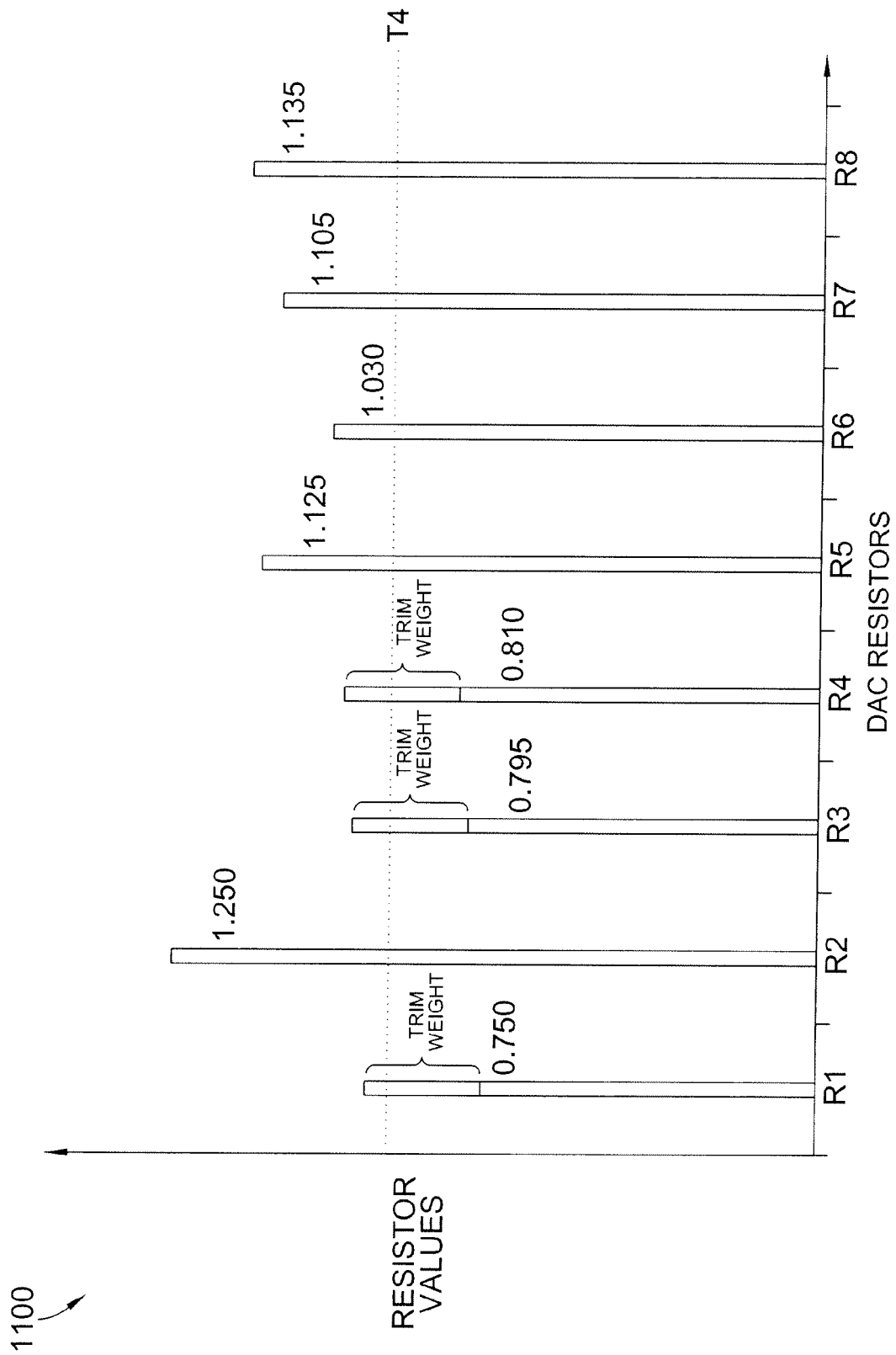
FIG. 11 is the resulting resistor bar plot when the resistors for the DAC shown in FIG. 8 are trimmed to target value T4.

As can be seen from the table, the target that yields the minimum peak INL is T4. Referring now to FIG. 11 the resulting resistor bar plot 1100 is shown after the resistive structure are trimmed to target T4. The trim code associated with the target is 10110000 as only resistive structures R1, R3 & R4 are below the target by an amount greater than or equal to Trim Weight/2. The resulting Peak INL is 0.12 LSBs. The INL plot is shown in FIG. 13. Curve 1304 is the untrimmed INL plot and curve 1306 is the case when the DAC is trimmed to target T4. Curve 1302 is the case when the DAC is trimmed to the maximum resistance value as is known in the art. For this specific example, target T4 and the resulting trim code 10110000 are actually the optimum trim combination, in other words the best that can be achieved with this architecture. This was actually proven by trying all of the possible 255 trim combinations and recording their peak INL. Thus, the algorithm of the present invention allowed finding the optimum trim code by trying just eight targets instead of trying all of the possible 255 trim codes. The algorithm of the present invention may not return the optimum trim combination at all times, even though it does for this particular example, This is because the algorithm is heuristic and is based on the assumption that the peak INL will be minimized when all the identical structures in the network are trimmed to the same target value. Even though this is a good assumption it is not true for all possible cases. Thus it cannot be guaranteed that the algorithm of the present invention will come up with the optimum trim code. What is guaranteed, however, is the fact that the number of targets to be simulated is greatly reduced and the algorithm will never produce a result that would make the Peak INL worse than the untrimmed value. This is because, for every target, the estimated Peak INL is compared to the untrimmed Peak INL as well as all the Peak INLs that resulted from all the other targets. In other words for the above example if all the targets T1-T8 had produced peak INLs greater than 0.40 which is the untrimmed Peak INL, then the algorithm would produce a final trim code of 0000000 which would guarantee that the Peak INL would not get any worse.

Figure 12:
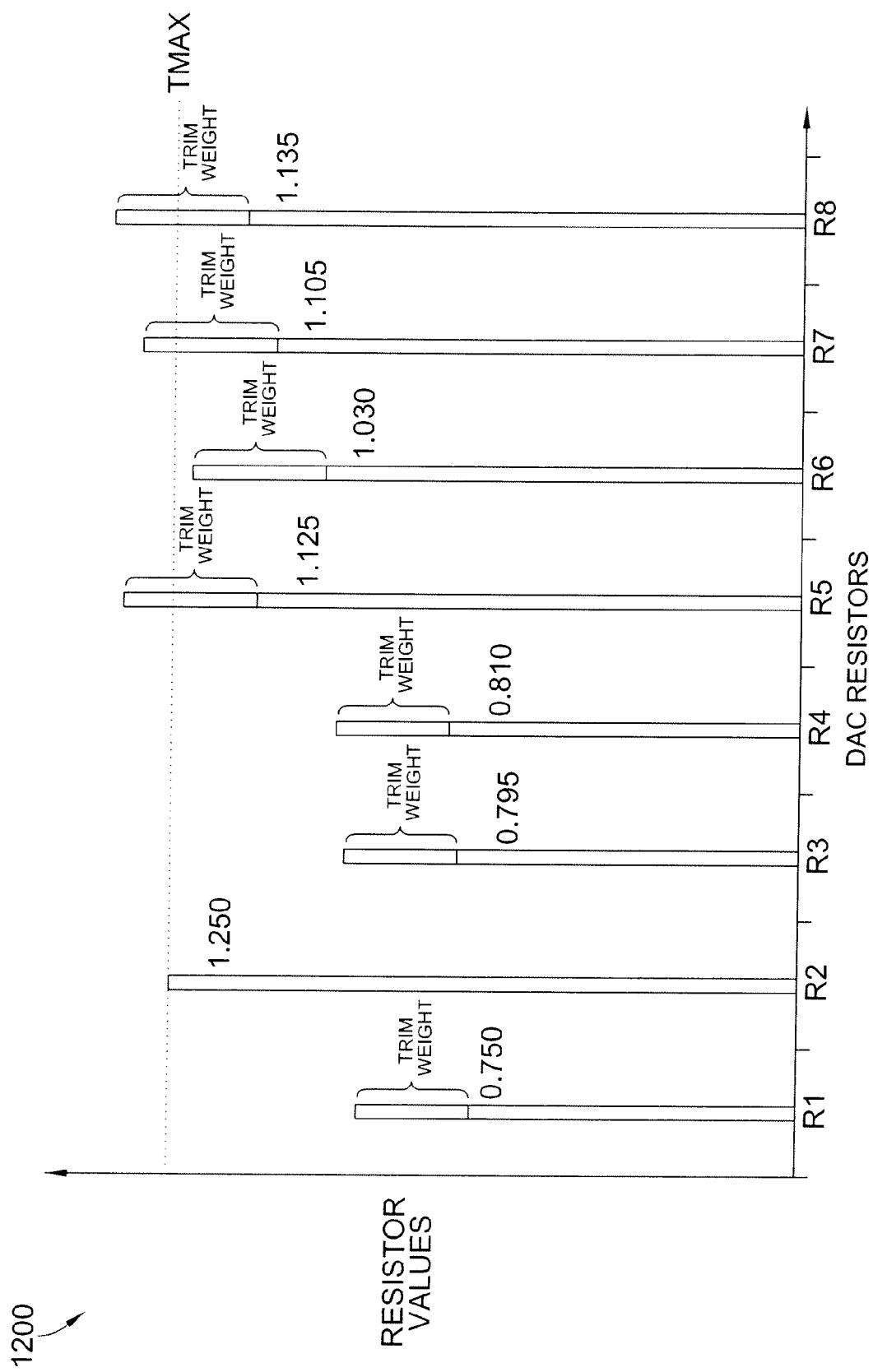
FIG. 12 is the resulting resistor bar plot when the resistors for the DAC shown in FIG. 8 are trimmed to the maximum resistor value.

Referring now to FIG. 12, the resistor bar plot 1200 shows how using the old algorithm that was designed for continuously adjustable elements fails with the discretely adjustable elements. For continuously adjustable elements the algorithm used is to trim all resistive structures in the network to the highest resistance value. So for the DAC in FIG. 8 this would mean trimming all resistive structures to 1.25Ω. The resulting resistor bar plot 1200 is shown in FIG. 12 and the corresponding INL plot is curve 1302 in FIG. 13 as previously mentioned. As can be seen from FIG. 13, trimming to the maximum resistance actually deteriorates the Peak INL instead of improving it.

In conclusion, the trim algorithm is based on the assumption that the Peak INL is minimized by trimming all the resistive structures in the string network to the same target value. With this basic assumption, the number of targets can be greatly reduced (in the actual implementation the targets are reduced from 7.9E28 to 224) making estimation of Peak INL possible in a reasonable amount of testing time. The trim algorithm according to the present invention in most cases produces results that are optimum or substantially close to optimum and is guaranteed not to deteriorate the Peak INL compared to the untrimmed Peak INL.

It will be appreciated by those skilled in the art that the present invention can be used in any network with a higher or lower degree of usefulness. Furthermore, the fixed and adjustable elements in the network need not be restricted to resistors, as other elements could also be used. The network could be implemented as a network of capacitors, transistors, inductors, diodes or other elements if desired. As long as there exist pairs of fixed elements and discretely adjustable elements in the network, the trim algorithm of the present invention is applicable thereto.

Having described and illustrated the principle of the invention in a preferred embodiment thereof, it is appreciated by those having skill in the art that the invention can be modified in arrangement and detail without departing from such principles. As but one example, increased resolution and increased number of outputs can be had by adding two or more fixed elements across each identical structure. Although a preferred method and embodiments have been shown, the exact details of the preferred method of the present invention can be changed as desired as required for a particular application. We therefore claim all modifications and variations coming within the spirit and scope of the following claims.

I claim:

1. A single-pass method of trimming a network, the method comprising:
providing a network formed by one or more pairs of one fixed element and one discretely adjustable element having at least one boundary condition;
selecting trim targets based upon the at least one boundary condition and having different trim codes;
calculating a peak INL for each trim code;
selecting the trim code that yields the minimum peak INL; and
trimming the network to the selected trim code,
wherein the network is subject to a single-pass output measurement.

2. The single-pass trim method of claim 1 wherein all of the pairs in the network are trimmed to the same target value.

3. The single-pass trim method of claim 1 wherein selecting trim targets comprises selecting A*B targets, wherein A is the total number of pairs of one fixed and one discretely adjustable element in the network and B is the total number of boundary conditions associated with the adjustable element.

4. The single-pass trim method of claim 3, wherein A is equal to thirty two and B is equal to seven.

5. The single-pass trim method of claim 1 wherein the pairs are trimmed such that the trimmed value of the pair is as close as possible to the target value that the pair is being trimmed to.

6. The single-pass trim method of claim 1 wherein the peak INL of the trimmed network is less than or equal to the peak INL of an untrimmed network.

7. An auto-calibration system comprising:
a network formed by one or more pairs of one fixed element and one discretely adjustable element having at least one boundary condition;
an ADC having an analog input coupled to said network and a digital output; and
a control circuit having an input coupled to the digital output of the ADC and an output for providing trim codes to said network,
wherein the trim codes are determined by the at least one boundary condition based upon a single-pass output measurement of the network.

8. The auto-calibration system of claim 7 wherein the trim codes are periodically updated.

9. The auto-calibration system of claim 7 wherein the trim codes are updated when a performance parameter drops below an acceptable limit.

10. The auto-calibration system of claim 7 wherein the trim codes are updated as desired by an end user.

11. The auto-calibration system of claim 7 further comprising a plurality of targets based upon the at least one boundary condition, each target having a different trim code.

12. The auto-calibration system of claim 11 further comprising a calculated peak INL for each trim code.

13. The auto-calibration system of claim 12 further comprising a selected trim code having a minimum peak INL that is used to trim the network.

14. The auto-calibration system of claim 7 wherein all of the pairs in the network are trimmed to the same target value.

15. A network comprising one or more pairs of one fixed element and one discretely adjustable element having at least one boundary condition, the network being trimmed by a method comprising:
selecting trim targets based upon the at least one boundary condition and having different trim codes;
calculating a peak INL for each trim code;
selecting the trim code that yields the minimum peak INL; and
trimming the network to the selected trim code, wherein the network is subject to a single-pass output measurement.

16. The network of claim 15 wherein all of the pairs in the network are trimmed to the same target value.

17. The network of claim 15 wherein selecting trim targets comprises selecting A*B targets, wherein A is the total number of pairs of one fixed and one discretely adjustable element in the network and B is the total number of boundary conditions associated with the adjustable element.

18. The network of claim 17, wherein A is equal to thirty two and B is equal to seven.

19. The network of claim 15 wherein the pairs are trimmed such that the trimmed value of the pair is as close as possible to the target value that the pair is being trimmed to.

20. The network of claim 15 further comprising one or more fixed elements coupled to each network pair for providing an increased resolution output.

21. The network of claim 15, wherein the network comprises part of a digital-to-analog converter.

22. The network of claim 15, wherein the network comprises part of an analog-to-digital converter.

23. The network of claim 15, wherein the network comprises part of a programmable gain amplifier.

24. The network of claim 15, wherein the network comprises part of a programmable attenuator.

25. The network of claim 15, wherein the network comprises part of a programmable resistor.

* * * * *